(12) United States Patent
Herman et al.

(10) Patent No.: US 6,781,203 B2
(45) Date of Patent: Aug. 24, 2004

(54) MOSFET WITH REDUCED THRESHOLD VOLTAGE AND ON RESISTANCE AND PROCESS FOR ITS MANUFACTURE

(75) Inventors: Thomas Herman, Manhattan Beach, CA (US); Harold Davis, San Diego, CA (US); Kyle Spring, Temecula, CA (US); Jianjun Cao, Temecula, CA (US)

(73) Assignee: International Rectifier Corporation, El Segundo, CA (US)

(*) Notice: Subject to any disclaimer, the term of this patent is extended or adjusted under 35 U.S.C. 154(b) by 0 days.

(21) Appl. No.: 10/044,427

(22) Filed: Nov. 9, 2001

(65) Prior Publication Data

US 2003/0089945 A1 May 15, 2003

(51) Int. Cl.[7] .............................................. H01L 29/46
(52) U.S. Cl. ....................... 257/341; 257/329; 257/330; 257/331
(58) Field of Search ......................... 257/341, 327–331, 257/334

(56) References Cited

U.S. PATENT DOCUMENTS

| | | | | |
|---|---|---|---|---|
| 4,680,853 A | * | 7/1987 | Lidow et al. ................. | 29/571 |
| 4,705,759 A | * | 11/1987 | Lidow et al. ................. | 437/29 |
| 5,016,066 A | * | 5/1991 | Takahashi ................... | 357/23.4 |
| 5,047,833 A | * | 9/1991 | Gould .......................... | 357/71 |
| 5,162,883 A | * | 11/1992 | Fujihira ...................... | 257/139 |
| 5,557,127 A | * | 9/1996 | Ajit et al. .................... | 257/339 |
| 5,703,390 A | * | 12/1997 | Itoh ............................ | 257/337 |
| 5,742,087 A | * | 4/1998 | Lidow et al. ............... | 257/342 |
| 5,904,510 A | * | 5/1999 | Merrill et al. .............. | 438/154 |
| 5,940,721 A | * | 8/1999 | Kinzer et al. ............... | 438/454 |
| 6,096,607 A | * | 8/2000 | Ueno .......................... | 438/268 |
| 6,207,508 B1 | * | 3/2001 | Patel .......................... | 438/268 |
| 6,255,692 B1 | * | 7/2001 | Huang ........................ | 257/341 |
| 6,262,439 B1 | * | 7/2001 | Takeuchi et al. ............. | 257/77 |
| 6,297,534 B1 | * | 10/2001 | Kawaguchi et al. ........ | 257/341 |

* cited by examiner

*Primary Examiner*—Mary Wiczewald
*Assistant Examiner*—Monica Lewis
(74) *Attorney, Agent, or Firm*—Ostrolenk, Faber, Gerb & Soffen, LL

(57) ABSTRACT

A vertical conduction MOSFET having a reduced on resistance $R_{DSON}$ as well as reduced threshold voltage $V_{th}$, and an improved resistance to punchthrough and walkout has an extremely shallow source diffusion, of less than 0.3 microns in depth and an extremely shallow channel diffusion, of less than about 3 microns in depth. In a P channel version, phosphorus is implanted into the bottom of a contact trench and into the channel region with an implant energy of 400 keV for a singly charged phosphorus ion or 200 keV for a doubly charged ion, thereby to prevent walkout of the threshold voltage.

7 Claims, 2 Drawing Sheets

MOSFET WITH REDUCED THRESHOLD VOLTAGE AND ON RESISTANCE AND PROCESS FOR ITS MANUFACTURE

FIELD OF THE INVENTION

This invention relates to power MOSFETs and more particularly to a novel process and resulting product which allows a reduction in threshold voltage while retaining a low on-resistance.

BACKGROUND OF THE INVENTION

MOSFETs and processes for their manufacture are well known. A typical device and process for its manufacture is disclosed in copending application Ser. No. 09/436,302, filed Nov. 8, 1999 entitled LOW VOLTAGE MOSFET AND PROCESS FOR ITS MANUFACTURE AND CIRCUIT APPLICATION (IR-1531) which is incorporated herein by reference.

One limitation encountered in making low voltage (under 50 volts), low on resistance ($R_{DSON}$) MOSFETs is the Rdson test condition at a low $V_{gs}$. To provide a low $V_{gs}$ gate drive condition the channel component of Rdson becomes increasingly larger, eventually becoming larger than all of the other components combined. There are several known ways of reducing this channel component of on resistance under these circumstances but one of the most direct is to lower the threshold voltage $V_{th}$, ensuring that the device is fully on at the low $V_{gs}$ condition. In many cases the gate oxide thickness can be reduced to lower the threshold voltage. However, when this thickness is fixed due to $V_{gs}$ max concerns, other means must be used.

The threshold voltage, $V_{th}$, can also be reduced if the channel dose is lowered. In addition, the channel junction must be shallow so that the channel length can be kept short. To maintain the shallow channel junction, the overall thermal budget, that is, the cumulative diffusion drive cycles, must be low. This introduces constraints on the shape of the source region so that its shape is more "oblong" (or elongated in depth) in the vertical direction relative to the substrate surface than under other conditions. This creates a region in the device where the corner of the source region is very near the "corner" (in cross-section) of the channel junction.

FIG. 1 is an idealized sketch of a vertical conduction MOSFET cell after the formation of the source and channel diffusions and a trench for a contact. The structure shown is for a P channel device, although all conductivity types can be reversed for an N channel device. In FIG. 1, a P type epitaxially deposited substrate (and drain region) 10 receives, in a conventional DMOS process, an N type channel implant and diffusion 11 and a P type source implant and diffusion 12. The window in gate structure 13 is the implant widow for both regions 11 and 12. Note that the source junction 12 is very close to channel junction 11 at the corner of the device cell, shown as distance "X". Thus, because, thermal treatment after the formation of channel junction 11 must be kept to a minimum, there is relatively little lateral diffusion of the source junction 12 under gate 13. The shape of source junction 13 is therefore deeper with less lateral spreading than usually found, i.e. more "oblong" than a typical diffused junction. Consequently, dimension "X" is reduced so that, when the diode junction 11 is reverse biased, punchthrough occurs at low voltage.

The punchthrough condition introduces unnecessary leakage from the drain to the source. Punchthrough is a phenomena associated with the merging of the depletion regions of the source and drain junctions and occurs when the channel length is small, so that, as the depletion region forms in the reverse biased body diode, it extends to the source region where majority carriers are forced into the body diode depletion region, creating premature leakage from drain to source, before reaching the avalanche condition. Further, $V_{th}$ was unstable with time, particularly with P channel devices, (similar to the condition known as walkout). The condition of walkout manifests itself with a gradually increasing voltage as a function of time, for the same applied current. The scale could be a few milliseconds to 100's of milliseconds (in the worst condition) and is very undesirable.

Referring to FIG. 1, it will be seen that a trench 20 is formed. A heavily doped, shallow N+ base 21 is implanted in the bottom of the trench to serve as a good contact region for the body diode. The trench 20 is especially useful in P channel devices. Body 21 has been made in the past by a phosphorus implant employing normally used implant energies.

Thus, the resulting device in the prior art had a tradeoff of increased on resistance for low $V_{gs}$; and further, P channel devices exhibited walkout. More particularly, in the prior art, it was known that $V_{gs}$ could be reduced by lower channel concentration, at the cost of increased $R_{DSON}$; or by reducing gate oxide thickness, at the cost of reduced gate ruggedness. Also, it was known that $R_{DSON}$ could be reduced by using a shorter channel and using a deeper source, but that increased the likelihood of punchthrough.

It would be very desirable to provide a process and structure which resolves these tradeoffs in which the $V_{gs}$, and $R_{DSON}$ can be both reduced without creating a punchthrough condition or, in P channel devices, a walkout condition.

BRIEF SUMMARY OF THE INVENTION

In accordance with the present invention, both $R_{DSON}$ and $V_{th}$ are simultaneously reduced by the control of the positions and shapes of the source and channel regions and by the proper control of the spreading of the reversed biased depletion region.

This novel process and design revolves around three concepts:

1) Controlling the relative position and shape of the source and channel regions. This is achieved by making the source implant as shallow as possible to limit punchthrough. Thus, the source implant energy is constrained to be as low as possible, right to the verge of beam blowup. This implant and its associated diffusion is done ideally within the framework of a very shallow channel junction. By way of example, the source and channel implants are preferably less than 0.3 $\mu$ and 3.0 $\mu$, respectively.

2) Controlling the reverse biased depletion region spreading by the amount and distribution of charge buried deep within the channel junction. For a p channel device, this is done by using a very high energy implant, in this case a 200 kV implant of doubly charged phosphorus ions P++ (resulting in an effective 400 keV implant). This implant also helps to limit the occurrence of punchthrough. This is accomplished by a heavy base implant that is placed as deep as possible by implanting doubly ionized phosphorus at very high energies. This charge, when placed strategically, acts as charge balance for the reverse biased diode, limiting depletion spreading into the channel side (as opposed to the epi side) of the junction. Similar concepts apply to the N channel device.

3) In addition, the extra depth of the 400 keV implant helps to make the $V_{th}$ measurement stable with time. It is thought that when the heavy dose of the P++ implant is deeper due to the high energy of the implant, that the increased charge makes it more difficult for a walkout condition to occur. Typically, walkout occurs in more lightly doped regions (e.g. it is often a problem in high voltage devices).

DETAILED DESCRIPTION OF THE DRAWINGS

Figure 2:
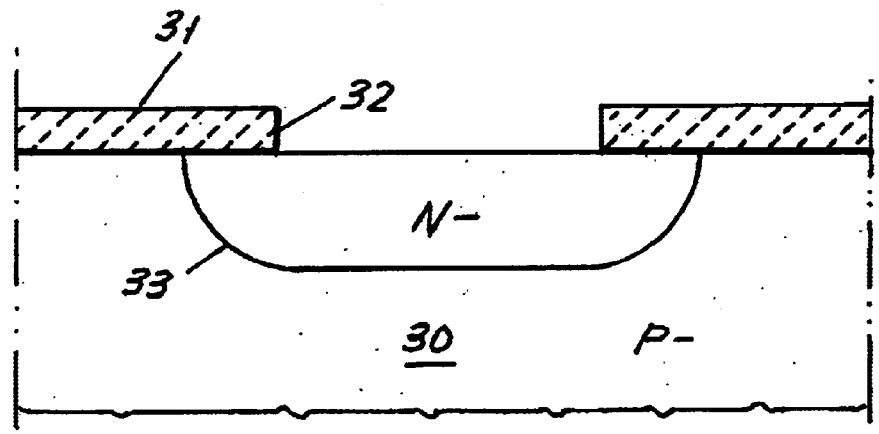
FIG. 2 shows a small area of silicon at a first stage of the manufacture of a cell in accordance with the invention and the formation of the channel junction.

Referring to FIG. 2, there is shown a single cell of a vertical conduction MOSFET (which may have a stripe, or closed polygonal topology) in which, for a P channel device, a P⁻ epitaxial layer 30 of silicon has a passivation layer 31 thereon which has a window 32 cut therein. A channel region 33 (or junction 33) is then formed by the implant of phosphorus at 120 keV and a dose of $1.2E14$ atoms/cm². This implant is then diffused for 30 minutes at 1175° C., forming the junction 33 to a depth which is less than about 3 microns.

Figure 3:
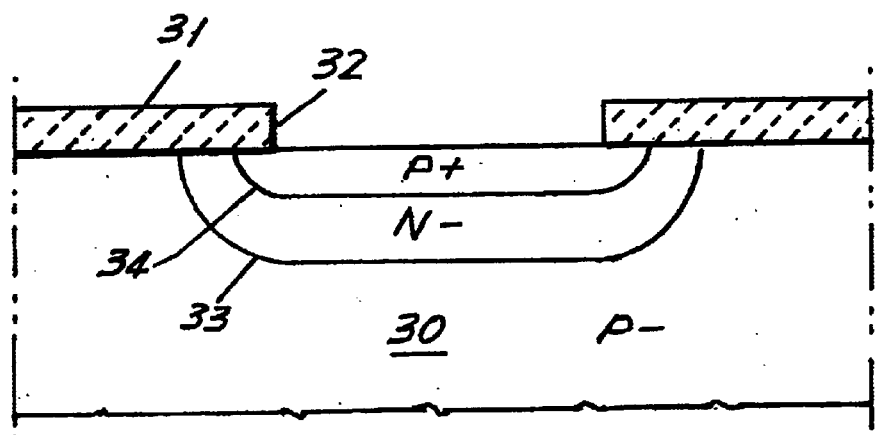
FIG. 3 shows the section of FIG. 2 after the formation of the source region.

Next, as shown in FIG. 3, a source region 34 (or junction 34) is implanted through window 32 at the lowest possible implant energy so that it is as shallow as possible. By way of example, source region 34 is formed by a boron implant at less than about 20 keV and $2E15$ ions/cm², with source junction 34 having a depth of less than 0.3 microns.

Figure 4:
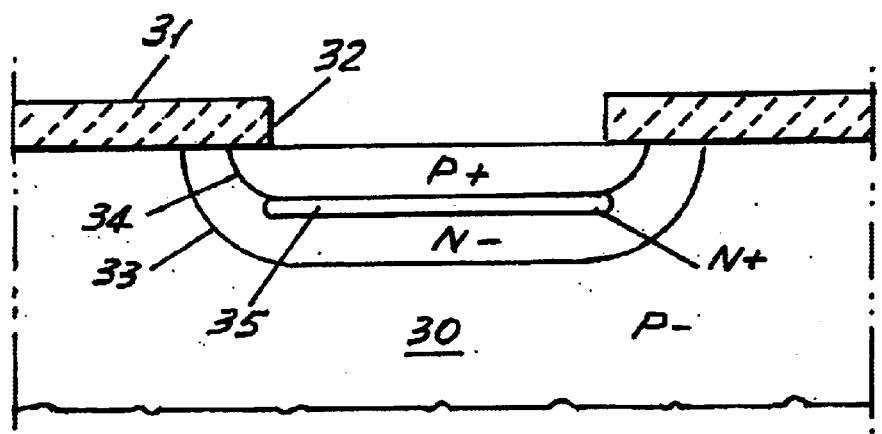
FIG. 4 shows the section of FIG. 3 after the implant of the heavy base implant.

A third implant is then carried out to form the N++ contact implant 35 shown in FIG. 4. The contact trench may be first formed. The implant of phosphorus may be carried out at an energy greater than 350 keV (for a single charge phosphorus ion) and a dose greater than $1E15$ ions/cm². The energy of the implant is more critical than the dose.

All implants are activated with activation temperatures of 1175° C. for about 30 minutes.

Figure 1:
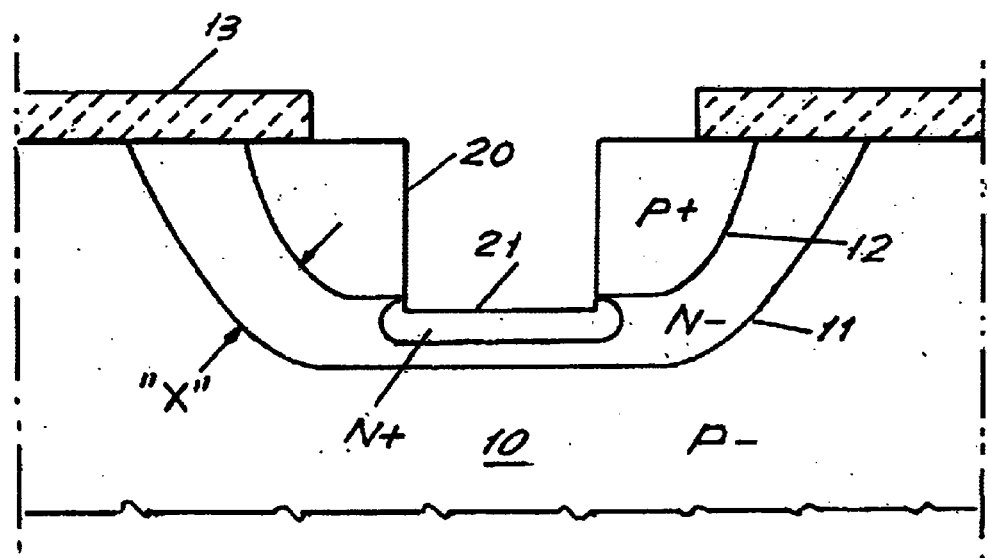
FIG. 1 shows the structure of a single cell of a MOSFET of the prior art.
Figure 5:
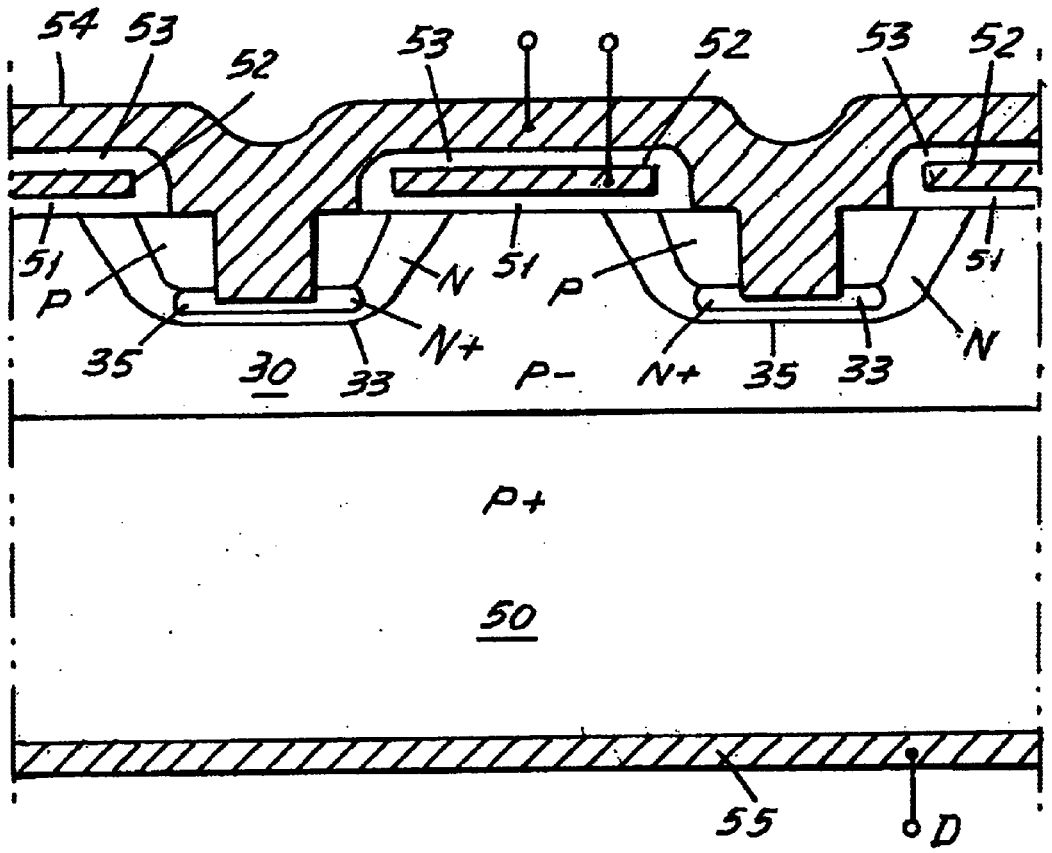
FIG. 5 shows plural cells of the type shown in FIG. 4 in a MOSFET, along with its source, drain and gate contact electrodes.

FIG. 5 shows a portion of a vertical conduction MOSFET employing the cells of FIG. 4. Note that the epi layer 30 is grown atop a P+ substrate 50. FIG. 5 further shows the gate structure as consisting of a gate oxide lattice 51 which extends across the lateral invertible channel in each of the channel regions, and a conductive polysilicon gate layer 52 atop lattice 51. The polysilicon gate 52 is sealed and insulated by an LTO (low temperature oxide) layer 53. A source contact 54 then overlies the top surface and contacts the source and channel regions of each of the cells. A drain contact 55 is disposed on the bottom of substrate 50.

The novel MOSFET so produced has both a low threshold voltage (below 2 volts) and a low $R_{DSON}$ (below 5 mΩ) at low $V_{gs}$ (which may be as low as 2.5 volts). This expanded "window" of values was previously highly constrained by $I_{DSS}$, due to punchthrough on the one hand and low $V_{th}$ on the other hand.

As a further aspect of the invention, it has been found that $V_{th}$ walkout is eliminated for P channel MOSFETs. Further, for both P and N channel devices, the $V_{th}$ is 50% lower than that previously attainable, thus dramatically improve gate robustness, gate rating and, at the same time, provide a reduced gate charge.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A vertical conduction power MOSFET, comprising:

a die of monocrystaline silicon, said die being of a first conductivity type and having a first and a second surface;

a relatively thin layer of epitaxially grown silicon of said first conductivity type on said first surface;

a plurality of spaced channel regions of a second conductivity type diffused into the surface of said layer of epitaxially grown silicon;

a plurality of respective source diffusion regions of said first conductivity type, each of respective source diffusion regions being diffused into each of said plurality of spaced channel regions and each said respective source diffusion region being shallower than each of said plurality spaced channel regions and having a smaller area than each of said plurality spaced channel regions, and defining at least one lateral invertible channel region in a space between its periphery and its respective channel region;

a MOS gate structure overlying each of said lateral invertible channel regions;

a source electrode overlying a surface of said die and connected to each of said plurality of spaced channel regions and said respective source diffusion regions, and insulated from said MOS gate structure; and a drain electrode coupled to said layer of epitaxially grown silicon, wherein each of said plurality of spaced channel regions has a depth of less than 3 microns, and each of said respective source diffusion regions has a depth of less than 0.3 microns.

2. The MOSFET of claim 1, which further includes a rectangular trench extending through the center of each of said plurality of source regions and into its respective channel region; and a high concentration contact diffusion of said first conductivity type disposed in the bottom of said trench; said source contact filling said trench and contacting said high concentration diffusion.

3. The MOSFET of claim 1, wherein said lateral invertible channels have a length of less than about 1 microns, whereby the distance between respective pairs of said source and channel regions at their corner points of maximum curvature is about 2.5 microns.

4. The MOSFET of claim 3, which further includes a rectangular trench extending through the center of each of said plurality of source regions and into its respective channel region; and a high concentration contact diffusion of said first conductivity type disposed in the bottom of said trench; said source contact filling said trench and contacting said high concentration diffusion.

5. The MOSFET of claim 1, wherein said fist and second conductivity types are N and P respectively.

6. The MOSFET of claim 5, which further includes a rectangular trench extending through the center of each of said plurality of source regions and into its respective channel region; and a high concentration contact diffusion of said first conductivity type disposed in the bottom of said trench; said source contact filling said trench and contacting said high concentration diffusion.

7. The MOSFET of claim 6, wherein said first concentration type is N and wherein said high concentration contact diffusion is a phosphorus diffusion formed with an effective implant energy of greater than about 350 keV for a singly charged phosphorous ion.

* * * * *